(12) United States Patent
Daigle

(10) Patent No.: US 8,817,517 B2
(45) Date of Patent: Aug. 26, 2014

(54) ONE-TIME PROGRAMMABLE FUSE READ

(75) Inventor: Tyler Daigle, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 179 days.

(21) Appl. No.: 13/341,609

(22) Filed: Dec. 30, 2011

(65) Prior Publication Data

US 2013/0170276 A1 Jul. 4, 2013

(51) Int. Cl.
*G11C 17/00* (2006.01)

(52) U.S. Cl.
USPC . 365/96; 365/186; 365/189.011; 365/189.09; 365/100

(58) Field of Classification Search
USPC ........... 365/96, 189.011, 189.14, 189.15, 365/189.05, 189.07, 189.09, 225.7
See application file for complete search history.

(56) References Cited

U.S. PATENT DOCUMENTS

| | | | | |
|---|---|---|---|---|
| 7,742,352 | B1 * | 6/2010 | Hara et al. | 365/210.1 |
| 7,936,582 | B1 | 5/2011 | Zhou et al. | |
| 8,143,902 | B2 * | 3/2012 | Huang et al. | 324/550 |
| 8,223,575 | B2 * | 7/2012 | Lin et al. | 365/225.7 |
| 8,441,266 | B1 * | 5/2013 | Xiao et al. | 324/550 |
| 8,508,307 | B2 * | 8/2013 | Mitsuda et al. | 331/176 |
| 8,686,596 | B2 * | 4/2014 | Huss et al. | 307/86 |
| 2006/0215465 | A1 * | 9/2006 | Bhavnagarwala et al. | 365/189.12 |
| 2011/0175699 | A1 * | 7/2011 | Huss et al. | 337/143 |
| 2012/0008410 | A1 * | 1/2012 | Huynh et al. | 365/185.21 |
| 2012/0044757 | A1 * | 2/2012 | Chung | 365/173 |
| 2012/0281450 | A1 * | 11/2012 | Lee et al. | 365/96 |

FOREIGN PATENT DOCUMENTS

CN 103187096 A 7/2013

OTHER PUBLICATIONS

"Chinese Application Serial No. 201220741800.5—Office Action Response", 7 pgs.
"Chinese Application Serial No. 201220741800.5, Notification to Make Rectification mailed Apr. 25, 2013", 2 pgs.

* cited by examiner

*Primary Examiner* — Fernando Hidalgo
(74) *Attorney, Agent, or Firm* — Schwegman, Lundberg & Woessner, P.A.

(57) ABSTRACT

This document discusses, among other things, a reference voltage generator circuit coupled to a plurality of fuse read circuits. The reference voltage generator circuit can be configured to mirror a reference current to produce a reference voltage and a gate bias voltage. The plurality of fuse read circuits can each be coupled to the reference voltage generator circuit and can also be coupled to a fuse of a plurality of fuses. Each fuse read circuit of the plurality of fuse read circuits can be configured to mirror the reference current using the gate bias voltage to produce a fuse read voltage across each fuse coupled to the plurality of fuse read circuits. Each fuse read circuit of the plurality of fuse read circuits can compare the fuse read voltage of each fuse and the reference voltage and can indicate a state of each fuse coupled to each fuse read circuit using the comparison.

20 Claims, 4 Drawing Sheets

ONE-TIME PROGRAMMABLE FUSE READ

BACKGROUND

Digital memory devices can include memory devices having one-time programmable (OTP) memory elements. An example OTP memory element can include a fuse, which may be a non-volatile memory element that can be programmed or blown by passing a current through the fuse. Typically, a voltage across a fuse cell can be read in order to determine whether the fuse has been programmed. The fuse cell can be read by comparing the fuse cell voltage to a reference voltage.

For a memory device having a plurality of OTP memory elements, each fuse can be read by comparing the voltage across each fuse to a reference voltage. However, the reference voltage must typically be generated for each fuse to be measured using circuitry. Thus, each fuse requires designated circuitry for generating the reference voltage, which can take up a large amount of space on the board.

Additionally, OTP memory elements can be read using a comparator and/or a latch to determine the state (e.g., programmed or unprogrammed) of each OTP memory element. However, the combination of comparators, latches, and fuses often operates at a lower voltage than the operating voltages of the latches and fuses alone.

OVERVIEW

This document discusses, among other things, a reference voltage generator circuit coupled to a plurality of fuse read circuits. The reference voltage generator circuit can be configured to mirror a reference current to produce a reference voltage and a gate bias voltage. The plurality of fuse read circuits can each be coupled to the reference voltage generator circuit and can also be coupled to a fuse of a plurality of fuses. Each fuse read circuit of the plurality of fuse read circuits can be configured to mirror the reference current using the gate bias voltage to produce a fuse read voltage across each fuse coupled to the plurality of fuse read circuits. Each fuse read circuit of the plurality of fuse read circuits can compare the fuse read voltage of each fuse and the reference voltage and can indicate a state of each fuse coupled to each fuse read circuit using the comparison.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In an example, a system can include a device having one or more processors configured to be communicatively coupled to a memory device. The memory device can be any type of memory device, including read-only memory such as, e.g., programmable read-only memory (PROM), field programmable read-only memory (FPROM), one-time programmable (OTP) non-volatile memory, etc. In some examples, the memory device can include an OTP fuse, which can be programmed or blown by passing a current through the fuse.

In some embodiments, a system can include a reference voltage generator circuit and a plurality of fuse read circuits communicatively coupled to a plurality of fuses. The reference voltage generator circuit and the plurality of fuse read circuits can further be communicatively coupled to the one or more processors and can be capable of determining which memory cells in the memory device are programmed (or unprogrammed). The reference voltage generator circuit can produce a reference voltage which can be used for the plurality of fuses. The reference voltage can be compared with a voltage of each fuse in the plurality of fuses to determine which fuses are programmed (or unprogrammed). In some embodiments, a comparator is used to perform the comparison of the fuse voltage of a fuse and the reference voltage. A latch can be coupled to the comparator to store the result of the comparison of the voltages.

In some embodiments, the reference voltage generated by the reference voltage generator circuit can be a voltage that is close to the mid-operating range of the comparator used to compare the fuse voltage of the fuse and the reference voltage. Producing a reference voltage that is close to the mid-operating range of the comparator can ensure comparator accuracy during a maximum unprogrammed (e.g., unblown) fuse resistance of the fuse and during a minimum programmed (e.g., blown) fuse resistance of the fuse. Additionally, in some embodiments, the state of each memory element in the memory device can be read at low supply voltages. This can be beneficial in situations in which a comparator operates at a lower supply voltage than the operating voltage of the memory cells, allowing for more accurate readings of the memory device.

Figure 1:
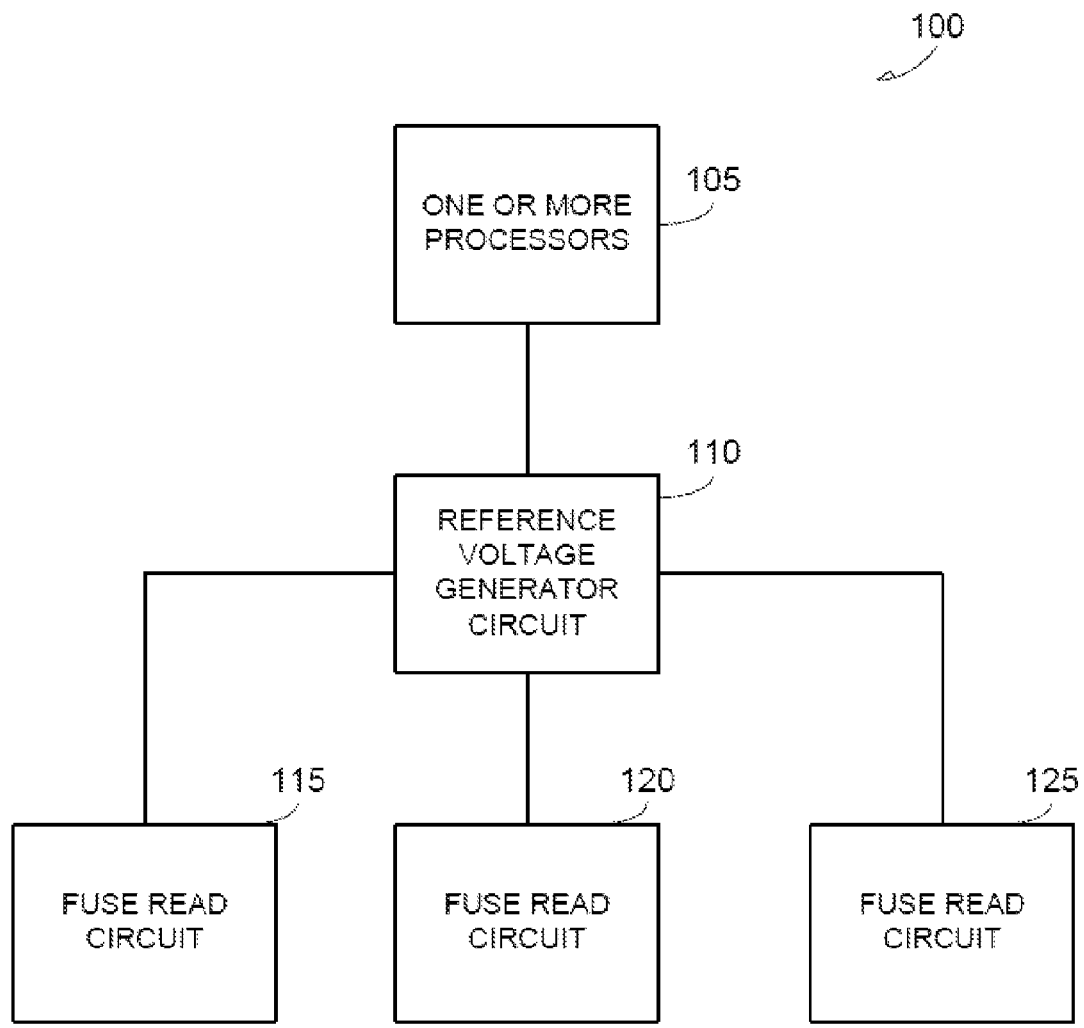
FIG. 1 illustrates generally an example of a system including a reference voltage generator circuit and a plurality of fuse read circuits.

FIG. 1 illustrates generally an example of a system 100 including one or more processors 105 communicatively coupled to a reference voltage generator 110 and a plurality of fuse read circuits 115, 120, and 125. The one or more processors 105 can initiate and process the reading of fuses in a memory device communicatively coupled to the plurality of fuse read circuits 115, 120, and 125.

The reference voltage generator circuit 110 can be configured to mirror a reference current (e.g., an externally generated reference current, etc.) to produce a reference voltage and a gate bias voltage. The reference voltage can be compared with fuse voltages of a plurality of fuses of a memory device in order to determine whether each fuse is programmed or unprogrammed.

Each fuse read circuit 115, 120, and 125 can include circuitry for determining a state (e.g., programmed or unprogrammed) of each fuse in the plurality of fuses. In some embodiments, each fuse read circuit 115, 120, 125 can include a comparator for comparing the reference voltage from the reference voltage generator circuit against the voltage of the fuse being measured. The comparator can be any type of comparator for comparing two inputs. In some embodiments, the fuse read circuits 115, 120, and 125 can further include a latch for storing the state of the fuse as determined by the comparator. The latch can be any type of latch for storing a state.

Figure 2:
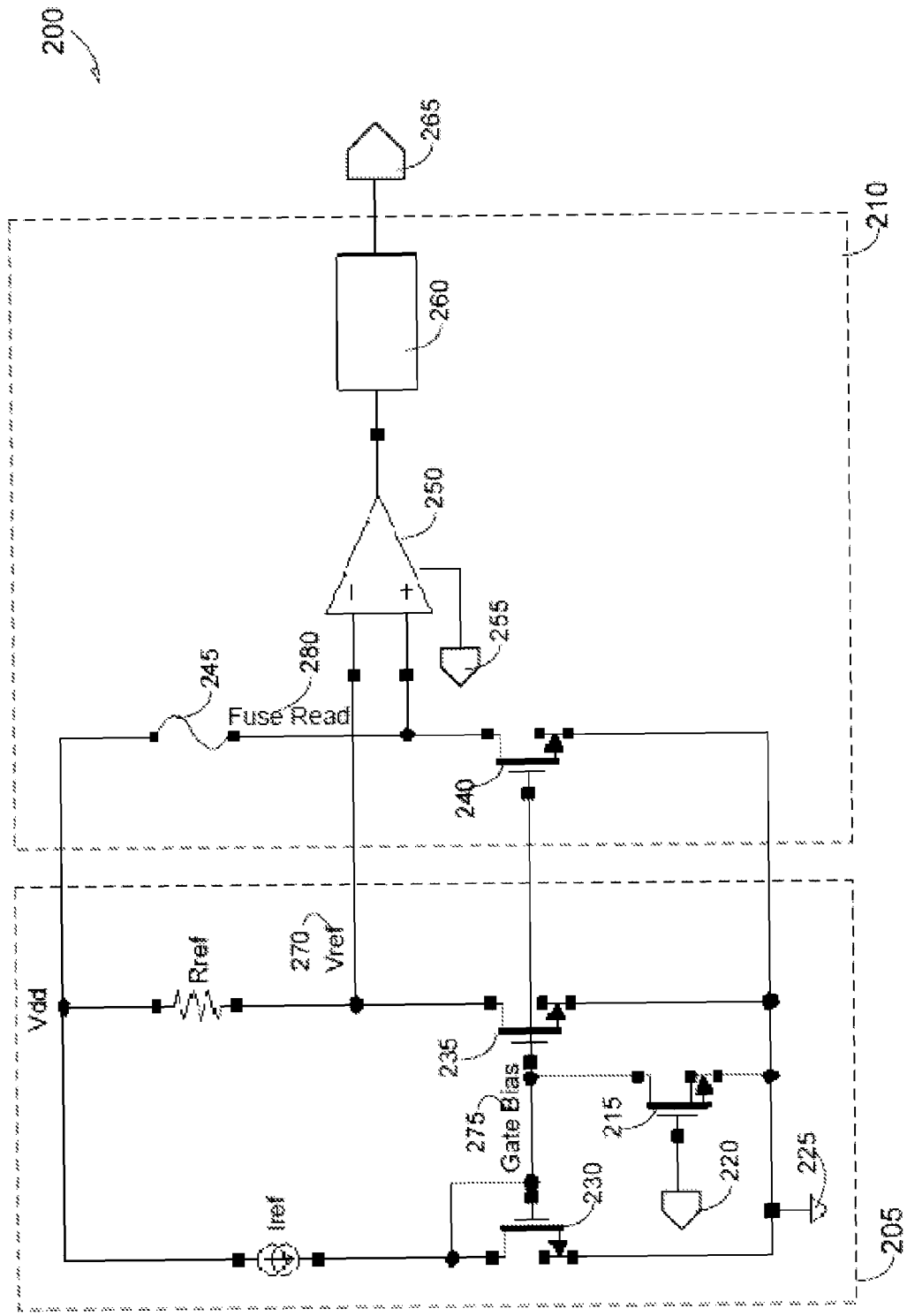
FIG. 2 illustrates generally an example of a system including a reference voltage generator circuit and a fuse read circuit of a fuse.

FIG. 2 illustrates generally an example of a system 200 including a reference voltage generator circuit 205 and a fuse read circuit 210 for reading a fuse 245. As discussed above, the reference voltage generator circuit 205 can be coupled to a plurality of fuse read circuits and can be used to read a plurality of fuses. The fuse read circuit 210 can be one of a plurality of fuse read circuits coupled to the reference voltage generator 205 via a reference voltage node (Vref) 270 and a gate bias node 275. The fuse 245 can be any type of fuse cell that can be programmed.

In FIG. 2, a supply voltage (Vdd) can be coupled to the reference voltage generator circuit 205 and the fuse read circuit 210 and can supply voltage to operate the circuitry. Additionally, a read enable voltage 220 to the transistor 215 and a read enable voltage 255 to a comparator 250 can be any voltage level used to begin the process of reading the fuse 245 (e.g., the voltage for turning on the transistors and the comparator 250).

In an example, a reference current (Iref) can be generated external to the reference voltage generator 205, and can be used to generate a gate bias voltage at the gate bias voltage node 275. The reference current (Iref) can be mirrored using transistors 230, 235 to create a current sink to generate the reference voltage at the Vref node 270 (e.g., the voltage drop from Vdd through the reference resistor (Rref)).

The gate bias voltage at the gate bias voltage node 275 can further create a plurality of current sinks to generate a plurality of fuse read nodes (one per fuse in the plurality of fuses, not shown), such as the fuse read node 280. In the example of FIG. 2, the fuse read voltage of the fuse 245 can be produced when the current is mirrored via transistor 240.

The comparator 250 can compare the reference voltage at the Vref node 270 and the fuse read voltage of the fuse 245 at the fuse read node 280. If the fuse read voltage is approximately zero volts, the fuse 245 can be programmed (e.g. blown), having a high resistance, and the comparator 250 can output a value indicating the fuse read voltage is less than the reference voltage. If the fuse read voltage is greater than the reference voltage, the fuse 245 can be unprogrammed (e.g., unblown), having little to no resistance, and the comparator 250 can output a value indicating the fuse read voltage is greater than the reference voltage.

In some embodiments, one comparator can be used to compare fuse read voltages for a plurality of fuses to the reference voltage. For example, instead of having a designated comparator to compare each fuse read circuit in the plurality of fuse read circuits in parallel, a single comparator can be coupled to more than one or all of the fuse read circuits in the plurality of fuse read circuits to compare each fuse read voltage of the plurality of fuses to the reference voltage sequentially.

The latch 260 can be coupled to the output of the comparator 250 to store the state (e.g., programmed or unprogrammed) of the fuse 245, even after the comparator 250 is disabled. The latch 260 can store the state of the fuse 245 so that one or more processors can determine whether the fuse 245 is programmed.

In some embodiments, the current being consumed by the devices while a fuse is being read can be controlled by setting a multiplying factor for components of the reference voltage generator circuit and the plurality of fuse read circuits. This can be done by using additional transistors (not shown) in the reference voltage generator circuit 205 to multiply current in any number of stages. For example, transistor 235 can have a multiplier Y, representing current multiplying using one or a set of transistors, and transistor 240 can have a multiplier X, representing current multiplying using one or a set of transistors. In some embodiments, the current being consumed by the devices while a fuse is being read can be controlled by setting the multiplying factors such that the product of Iref, Rref, and Y is approximately half of Vdd (e.g., Iref*Rref*Y≈Vdd/2). Rref and Y can be chosen based on a variety of design factors, such as the area Rref can consume on the board, the current consumed when using a larger multiplier, etc. Assuming Vdd is the mid-rail voltage value for the comparator 250 having a particular operating voltage range, setting the multiplier Y in this manner can cause the reference voltage to be in the mid-rail range, allowing the comparator 250 to read the fuse 245 more accurately.

In some embodiments, the multiplier X for transistor 240 can be set such that the product of X and the maximum unprogrammed (unblown) resistance (e.g., parasitic resistance) of the fuse 245 is less than the product of Y and Rref, which can be less than the product of X and the minimum programmed (blown) resistance (e.g., conductance) of the fuse 245 (e.g., X*Rmax_unblown<<Y*Rref<<X*Rmin_blown). Since the reference voltage and the fuse read voltage of the fuse 245 can both be generated from sink currents pulled down from the voltage supply, and since each sink current can be generated from the same gate bias voltage at gate bias voltage 275, the reference voltage and the fuse read voltage can track each other over shifts in Vdd and Iref, allowing the comparator 250 to read the fuse 245 more accurately. Such shifts can occur due to changes in temperature, supply voltage (Vdd), process variation or changes, etc.

The transistors 215, 230, 235, 240 can be any type of transistor capable of performing the operations described above and can each be coupled to ground 225. In some embodiments, low voltage threshold (LVT) devices can be used for current mirroring as well as comparing using the comparator 250. Since LVT devices can be known to leak in an off-state condition (e.g., sub-threshold region), standard devices can be used in series with any LVT device to limit off-state leakage.

Before a fuse is read, the latch output can be pulled to ground so that the fuse can be assumed to be unprogrammed until the fuse is read. In order to read a fuse, a power on reset (POR) signal can be asserted for the latch (after the latch output is pulled to ground in preparation for the read process). Once the POR is asserted, the read enable signal can be asserted to enable the comparator and the current sinks to read the fuse value. The latch can then be toggled according to the output of the comparator.

Figure 3A:
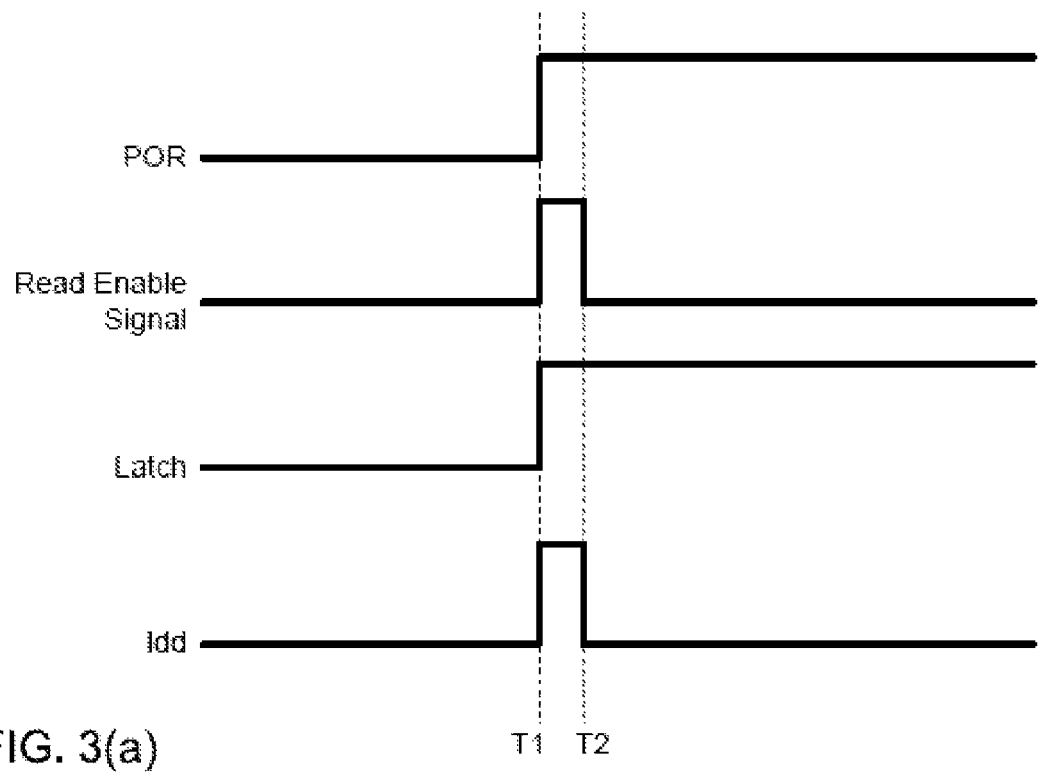
FIGS. 3(a)-(b) illustrate generally an example of signals during a fuse read.
Figure 3B:
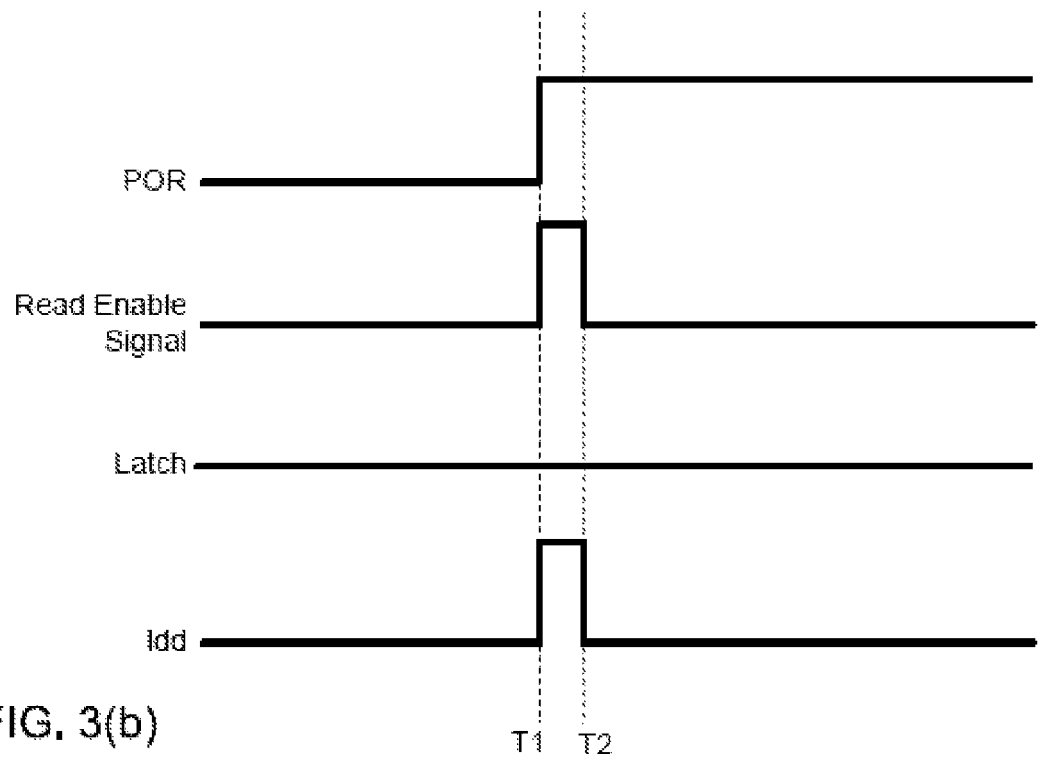

FIGS. 3(*a*)-(*b*) illustrate generally an example of signals during a fuse read. In FIGS. 3(*a*)-(*b*), the POR signal is asserted at time T1. Once the POR signal is asserted, the read enable signal can be asserted shortly after the POR signal is asserted to enable the comparator and the current sinks to read the fuse voltage. As illustrated in the examples of FIGS. 3(*a*) and 3(*b*), a latch that is pulled high (as shown in FIG. 3(*a*)) can indicate a programmed or blown fuse, and a latch that is pulled low (as shown in FIG. 3(*b*)) can indicate an unprogrammed or unblown fuse. However, in other examples, a latch that is pulled high can indicate an unprogrammed or unblown fuse, and a latch that is pulled low can indicate a programmed or unblown fuse, depending on design and configuration choices. Once the period of time for reading has passed, the read enable signal can dis-assert (at time T2), and the current consumed by the comparators and current sinks (Idd) can drop back to zero.

Figure 4:
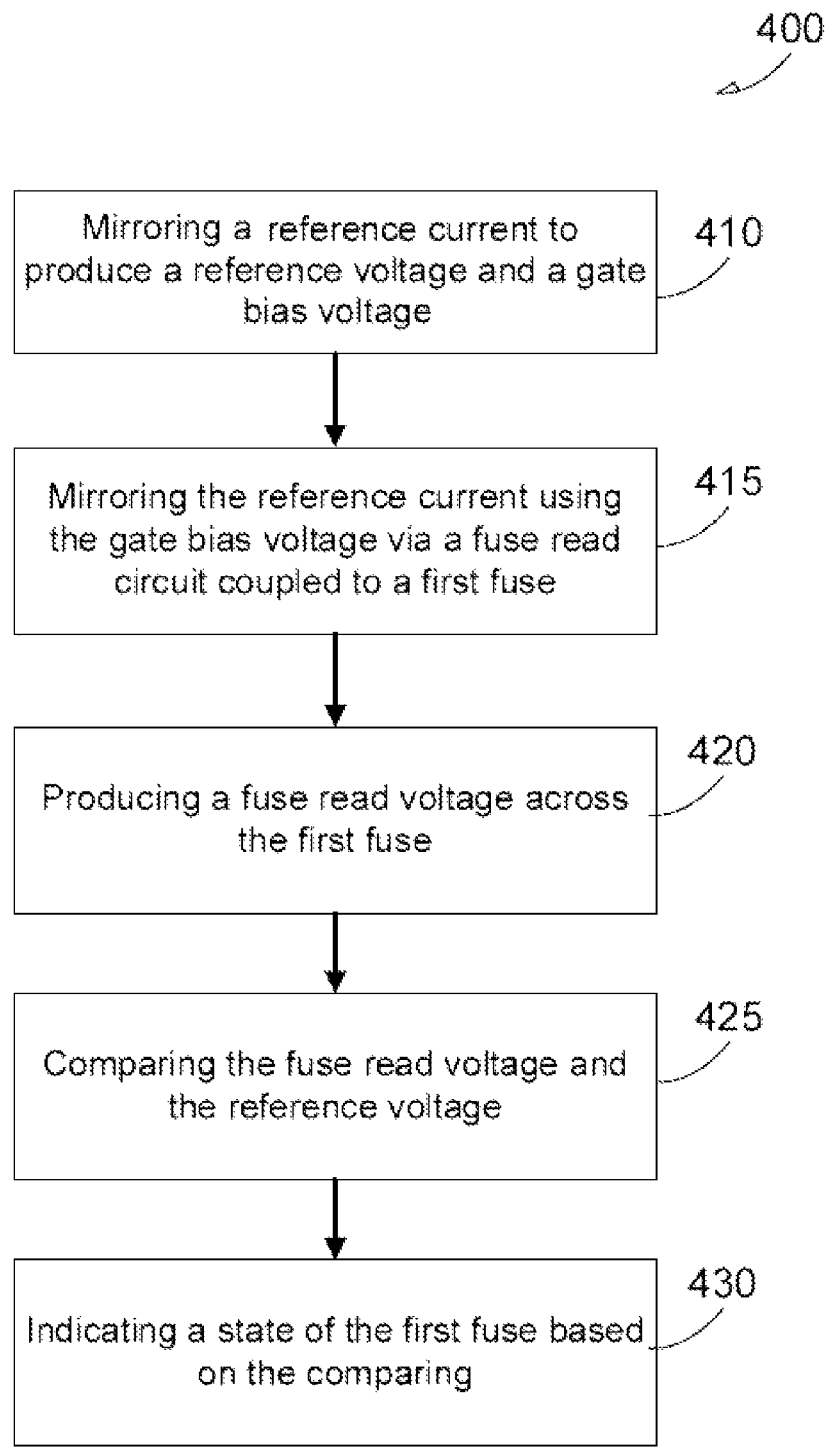
FIG. 4 illustrates generally examples of a method including reading a fuse.

FIG. 4 illustrates generally examples of a method 400 including reading a fuse. In operation 410, a reference current can be mirrored to produce a reference voltage and a gate bias voltage using a reference voltage generator circuit.

In operation 415, the reference current can be mirrored using the gate bias voltage via a fuse read circuit coupled to a first fuse to be read. The mirrored reference current of operation 415 can produce a fuse read voltage across the first fuse in operation 420.

In operation 425, a comparator can compare the fuse read voltage and the reference voltage. In operation 430, the output of the comparison can be sent to a latch to indicate a state of the first fuse based on the comparison.

Additional Notes and Examples

Example 1 includes subject matter (such as an apparatus) comprising a reference voltage generator circuit and a plurality of fuse read circuits each coupled to the reference voltage generator circuit and each further coupled to a fuse of a plurality of fuses. The reference voltage generator can be configured to mirror a reference current to produce a reference voltage and a gate bias voltage. Each fuse read circuit of the plurality of fuse read circuits can be configured to mirror the reference current using the gate bias voltage to produce a fuse read voltage across each fuse coupled to the plurality of fuse read circuits. Each fuse read circuit of the plurality of fuse read circuits can be configured to compare the fuse read voltage of each fuse to the reference voltage and to indicate a state of each fuse coupled to each fuse read circuit using the comparison.

In Example 2, the subject matter of Example 1 can optionally include each fuse read circuit having a comparator that can be configured to compare the fuse read voltage and the reference voltage.

In Example 3, the subject matter of one or any combination of Example 1 and 2 can optionally include a comparator coupled to each fuse read circuit of the plurality of fuse read circuits. The comparator can be configured to compare each fuse read voltage of each fuse coupled to each fuse read circuit and the reference voltage.

In Example 4, the subject matter of one or any combination of Examples 1-3 can optionally include the comparator having an operating voltage range, wherein the reference voltage is a voltage level within the operating voltage range.

In Example 5, the subject matter of one or any combination of Examples 1-4 can optionally include a plurality of latches each coupled to a fuse read circuit of the plurality of fuse read circuits. Each latch can be configured to indicate a state of the fuse coupled to the fuse read circuit.

In Example 6, the subject matter of one or any combination of Examples 1-5 can optionally include the reference voltage generator circuit and the plurality of fuse read circuits having low voltage threshold devices.

In Example 7, the subject matter of one or any combination of Examples 1-6 can optionally include a first state of a first fuse coupled to a first fuse read circuit of the plurality of fuse read circuits indicating that the first fuse is programmed when a first fuse read voltage across the first fuse is a value that is approximately zero.

In Example 8, the subject matter of one or any combination of Examples 1-7 can optionally include a first state of a first fuse coupled to a first fuse read circuit of the plurality of fuse read circuits indicating that the first fuse is unprogrammed when a first fuse read voltage across the first fuse is a value that is greater than the reference voltage.

Example 9 includes subject matter (such as a method) comprising mirroring a reference current to produce a reference voltage and a gate bias voltage using a reference voltage generator circuit. Using a fuse read circuit coupled to the reference voltage generator circuit and further coupled to a first fuse, the reference current is mirrored using the gate bias voltage to produce a fuse read voltage across the first fuse. The fuse read circuit can be one of a plurality of fuse read circuits each coupled to the reference voltage generator circuit and each further coupled to a fuse of a plurality of fuses. The fuse read voltage can be compared to the reference voltage, and a state of the first fuse can be indicated using a comparator.

In Example 10, the subject matter of or any combination of Examples 1-9 can optionally include using a first comparator of the fuse read circuit to compare the fuse read voltage and the reference voltage. Each fuse read circuit of the plurality of fuse read circuits can have a comparator.

In Example 11, the subject matter of one or any combination of Examples 1-10 can optionally include using a comparator to compare the fuse read voltage and the reference voltage. Each fuse read circuit of the plurality of fuse read circuits can be coupled to the comparator and the fuse read voltages can be read sequentially.

In Example 12, the subject matter of one or any combination of Examples 1-11 can optionally include using a latch to indicate a state of the first fuse.

In Example 13, the subject matter of one or any combination of Examples 1-12 can optionally include using a comparator having an operating voltage range to compare the fuse read voltage and the reference voltage. The reference voltage can be a voltage level within the operating voltage range.

In Example 14, the subject matter of one or any combination of Examples 1-13 can optionally include the state of the first fuse indicating that the first fuse is programmed when the fuse read voltage across the first fuse is a value that is approximately zero.

In Example 15, the subject matter of one or any combination of Examples 1-14 can optionally include the state of the first fuse indicating that the first fuse is unprogrammed when the fuse read voltage across the first fuse is a value that is greater than reference voltage.

Example 16 includes subject matter (such as a system) comprising a processor, a reference voltage generator coupled to the processor, and a plurality of fuse read circuits coupled to the processor. The plurality of fuse read circuits can each be coupled to the reference voltage generator circuit and each further coupled to a fuse of a plurality of fuses. The reference voltage generator can be configured to mirror a reference current to produce a reference voltage and a gate bias voltage. Each fuse read circuit of the plurality of fuse read circuits can be configured to mirror the reference current using the gate bias voltage to produce a fuse read voltage across each fuse coupled to the plurality of fuse read circuits. Each fuse read circuit of the plurality of fuse read circuits can be configured to compare the fuse read voltage of each fuse and the reference voltage and to indicate a state of each fuse coupled to each fuse read circuit using the comparison.

In Example 17, the subject matter of one or any combination of Examples 1-16 can optionally include each fuse read circuit having a comparator that can be configured to compare the fuse read voltage and the reference voltage.

In Example 18, the subject matter of one or any combination of Examples 1-17 can optionally include the comparator including an operating voltage range, wherein the reference voltage is a voltage level within the operating voltage range.

In Example 18, the subject matter of one or any combination of Examples 1-17 can optionally include a comparator coupled to each fuse read circuit of the plurality of fuse read circuits. The comparator can be configured to compare each fuse read voltage of each fuse coupled to each fuse read circuit and the reference voltage produced by the reference voltage generator circuit.

In Example 19, the subject matter of one or any combination of Examples 1-18 can optionally include the fuse read voltage and the reference voltage being compared using a comparator having an operating voltage range and wherein the reference voltage is a voltage level within the operating voltage range.

In Example 20, the subject matter of one or any combination of Examples 1-19 can optionally include a plurality of latches each coupled to a fuse read circuit of the plurality of fuse read circuits. Each latch can be configured to indicate a state of the fuse coupled to the fuse read circuit.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
   a reference voltage generator circuit configured to mirror a reference current to produce a reference voltage and a gate bias voltage; and
   a plurality of fuse read circuits each coupled to the reference voltage generator circuit and each further coupled to a fuse of a plurality of fuses, wherein each fuse read circuit of the plurality of fuse read circuits is configured to mirror the reference current using the gate bias voltage to produce a fuse read voltage across each fuse coupled to the plurality of fuse read circuits,
      wherein each fuse read circuit of the plurality of fuse read circuits is configured to compare the fuse read voltage of each fuse to the reference voltage and to indicate a state of each fuse coupled to each fuse read circuit using the comparison.

2. The apparatus of claim 1, wherein each fuse read circuit includes a comparator configured to compare the fuse read voltage and the reference voltage.

3. The apparatus of claim 1, further comprising:
   a comparator coupled to each fuse read circuit of the plurality of fuse read circuits, wherein the comparator is configured to compare each fuse read voltage of each fuse coupled to each fuse read circuit and the reference voltage.

4. The apparatus of claim 3, wherein the comparator includes an operating voltage range, and wherein the reference voltage is a voltage level within the operating voltage range.

5. The apparatus of claim 1, further comprising:
a plurality of latches each coupled to a fuse read circuit of the plurality of fuse read circuits, wherein each latch is configured to indicate a state of the fuse coupled to the fuse read circuit.

6. The apparatus of claim 1, wherein the reference voltage generator circuit and the plurality of fuse read circuits include low voltage threshold devices.

7. The apparatus of claim 1, wherein a first state of a first fuse coupled to a first fuse read circuit of the plurality of fuse read circuits indicates that the first fuse is programmed when a first fuse read voltage across the first fuse is a value that is approximately zero.

8. The apparatus of claim 1, wherein a first state of a first fuse coupled to a first fuse read circuit of the plurality of fuse read circuits indicates that the first fuse is unprogrammed when a first fuse read voltage across the first fuse is a value that is greater than the reference voltage.

9. A method comprising:
mirroring a reference current to produce a reference voltage and a gate bias voltage using a reference voltage generator circuit;
using a fuse read circuit coupled to the reference voltage generator circuit and further coupled to a first fuse, mirroring the reference current using the gate bias voltage to produce a fuse read voltage across the first fuse, the fuse read circuit being one of a plurality of fuse read circuits each coupled to a fuse of a plurality of fuses;
comparing the fuse read voltage and the reference voltage; and
indicating a state of the first fuse using the comparing.

10. The method of claim 9, wherein comparing the fuse read voltage and the reference voltage includes using a first comparator of the fuse read circuit, each fuse read circuit of the plurality of fuse read circuits having a comparator.

11. The method of claim 9, wherein comparing the fuse read voltage and the reference voltage includes using a comparator, each fuse read circuit of the plurality of fuse read circuits being coupled to the comparator.

12. The method of claim 9, including indicating a state of the first fuse using a latch.

13. The method of claim 9, wherein the fuse read voltage and the reference voltage are compared using a comparator having an operating voltage range and wherein the reference voltage is a voltage level within the operating voltage range.

14. The method of claim 9, wherein the state of the first fuse indicates that the first fuse is programmed when the fuse read voltage across the first fuse is a value that is approximately zero.

15. The method of claim 9, wherein the state of the first fuse indicates that the first fuse is unprogrammed when the fuse read voltage across the first fuse is a value that is greater than the reference voltage.

16. A system comprising:
a processor; and
a reference voltage generator circuit coupled to the processor and configured to mirror a reference current to produce a reference voltage and a gate bias voltage; and
a plurality of fuse read circuits coupled to the processor, the plurality of fuse read circuits each coupled to the reference voltage generator circuit and each further coupled to a fuse of a plurality of fuses, wherein each fuse read circuit of the plurality of fuse read circuits is configured to mirror the reference current using the gate bias voltage to produce a fuse read voltage across each fuse coupled to the plurality of fuse read circuits,
wherein each fuse read circuit of the plurality of fuse read circuits is configured to compare the fuse read voltage of each fuse and the reference voltage and to indicate a state of each fuse coupled to each fuse read circuit using the comparison.

17. The system of claim 16, wherein each fuse read circuit includes a comparator configured to compare the fuse read voltage and the reference voltage.

18. The system of claim 17, wherein the comparator includes an operating voltage range, and wherein the reference voltage is a voltage level within the operating voltage range.

19. The system of claim 16, further comprising:
a comparator coupled to each fuse read circuit of the plurality of fuse read circuits, wherein the comparator is configured to compare each fuse read voltage of each fuse coupled to each fuse read circuit and the reference voltage.

20. The system of claim 16, further comprising:
a plurality of latches each coupled to a fuse read circuit of the plurality of fuse read circuits, wherein each latch is configured to indicate a state of the fuse coupled to the fuse read circuit.

* * * * *